(12) United States Patent
Kanda

(10) Patent No.: US 6,776,089 B2
(45) Date of Patent: Aug. 17, 2004

(54) SCREEN PRINTER

(75) Inventor: Shinji Kanda, Aichi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/200,145

(22) Filed: Jul. 23, 2002

(65) Prior Publication Data

US 2003/0131742 A1 Jul. 17, 2003

(30) Foreign Application Priority Data

Jan. 11, 2002 (JP) ......................................... 2002-004166

(51) Int. Cl.[7] .............................................. B41F 15/18
(52) U.S. Cl. ..................... 101/126; 101/123; 101/127.1
(58) Field of Search ................................ 101/114, 123, 101/126, 129, 124, 127.1; 118/406, 213

(56) References Cited

U.S. PATENT DOCUMENTS 4,545,300 A * 10/1985 Jensen ........................ 101/123
4,637,308 A * 1/1987 Vidoni ........................ 101/114
4,649,817 A   3/1987 Smith
4,729,306 A   3/1988 Bubley
5,582,104 A * 12/1996 Best et al. .................. 101/126
5,937,752 A * 8/1999 Uchiyama ................. 101/127.1

FOREIGN PATENT DOCUMENTS

GB        2 346 584 A       8/1988
JP         2003-89190      *  3/2003

* cited by examiner

Primary Examiner—Leslie J. Evanisko (57) ABSTRACT

A printing apparatus that includes a table and screen plate positioned facing each other. A screen sealing unit is provided to ensure that a relative hermetic seal is achieved between the screen plate and the table. The sealing unit and table are movable, the sealing unit being movable along the table to adjust for various work pieces utilized in the screen. A gas is provided between the sealed table and screen plate to aid in printing.

9 Claims, 12 Drawing Sheets

SCREEN PRINTER

BACKGROUND OF THE INVENTION

1. Field of the Invention

The present invention relates to a screen printer used for such as printing a resist in case of printing or etching during the process of electrically wiring on a board. The invention relates to, in particular, a screen printer used for a screen printing method in which gas pressure between a screen mesh and a work is made higher than gas pressure at a side of printing using a squeegee of the screen mesh.

2. Description of the Related Art

Figure 9:
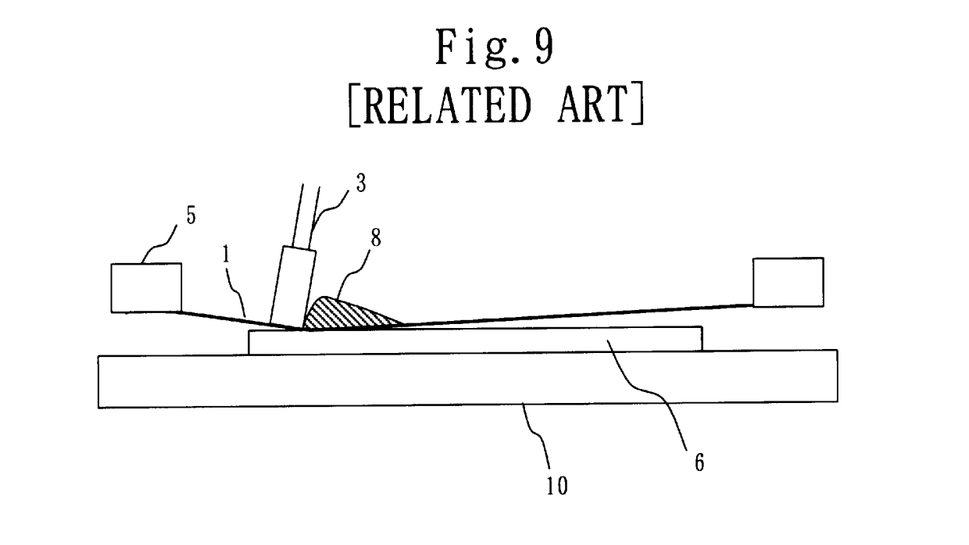
FIG. 9 explains a conventional screen printing.

FIG. 9 shows a conventional technique of a screen printer.

In FIG. 9, a reference numeral 1 shows a screen, 3 shows a squeegee, 5 shows a screen frame, 6 shows a work, 8 shows ink, and 10 shows a table.

According to the conventional screen printing, as shown in FIG. 9, a clearance of several mm is placed between the screen 1 and the work 6 which is a board to be processed. After supplied to the screen 1, the ink is spread by the squeeze 3 toward the user's side, while the squeegee 3 presses the screen 1 downward with stretching the screen 1 so that the screen 1 adheres to the work 6 of the board, and then the screen 1 is removed from the work 6 of the board due to the tension of the screen. Printing is thus performed on the work 6 of the board.

As for the clearance between the screen 1 and the work 6, for example, the clearance of 2–6 mm is placed when the internal size of the screen frame is 500 mm. Further, as greater the internal size of the screen frame becomes; such as 1,000 mm, 2,500 mm, and more, it is also required to make the clearance bigger. There are some problems in the conventional printing method, in which the clearance, for example, of 2–6 mm is placed between the screen 1 and the work 6. As the screen 1 is stretched for printing, the printing accuracy is not sufficient. It is required to make the screen 1 larger than the work of the board, which increases the cost of the screen 1. Moreover, as the screen 1 is stretched for printing, the screen 1 does not last long.

SUMMARY OF THE INVENTION

The present invention aims to improve the printing accuracy.

Further, the invention aims to make the screen smaller compared with the conventional processing pattern, which enables to reduce the cost of the screen.

Further, the invention aims to lengthen the life of the screen.

According to the present invention, a screen printer for performing screen printing using a screen plate includes:

a table placed facing the screen plate;

a screen sealing unit for nearly sealing a space between the screen plate and the table, and the screen sealing unit includes a screen receiving unit placed facing the screen plate and a sealing aid unit placed facing the table.

The screen printer of the invention further includes an elastic body, and the sealing aid unit is placed slidable along the table and is pressed to the screen receiving unit by the table through the elastic body.

In the screen printer of the invention, the screen sealing unit further includes a packing material, and the screen receiving unit has a projection part circularly formed, and the projection part is pressed to the sealing aid unit through the packing material.

According to another aspect of the invention, a screen printer for performing screen printing using a screen plate and a squeegee, includes a table placed facing the screen plate and having an opening, the screen printer performs screen printing on a work placed on the table using the screen plate and the squeegee, and supplies gas having a higher pressure than a pressure of atmosphere of a side of the screen plate opposite to the table, and the opening supplies gas to the screen plate, and is formed outside the work placed on the table and at least at one of fore and rear in a printing direction of the squeegee as a long slot which is long in an approximately right angle direction against the printing direction of the squeegee.

The screen printer of the invention further includes:

a regulator for controlling a pressure of the gas; and an opening valve for releasing a pressure which is increased by the gas supplied into the space between the screen plate and the table.

In the screen printer of the invention, the screen printer performs screen printing on a work using a squeegee, and the table includes a supply hole which is formed at least at one of fore and rear of the table in a printing direction of the squeegee and supplies gas toward the screen plate with an angle slanted to the work.

In the screen printer of the invention, the supply hole formed at least at one of sides of the table in a printing direction of the squeegee and supplies gas to the screen plate.

The screen printer of the invention further includes:

a filter for filtering the gas supplied to the space which is nearly sealed between the screen plate and the table; and a compressed gas generating unit for increasing a pressure of the gas filtered and supplying the gas of which the pressure is increased to the supply hole.

In the screen printer of the invention, the screen printer performs screen printing using ink including solvent, and the gas includes the solvent.

The screen printer of the invention further includes a supply hole for supplying gas into a space which is nearly sealed by the screen plate, the table, and the screen sealing unit.

BRIEF EXPLANATION OF THE DRAWINGS

A complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENT

Embodiment 1.

Figure 1:
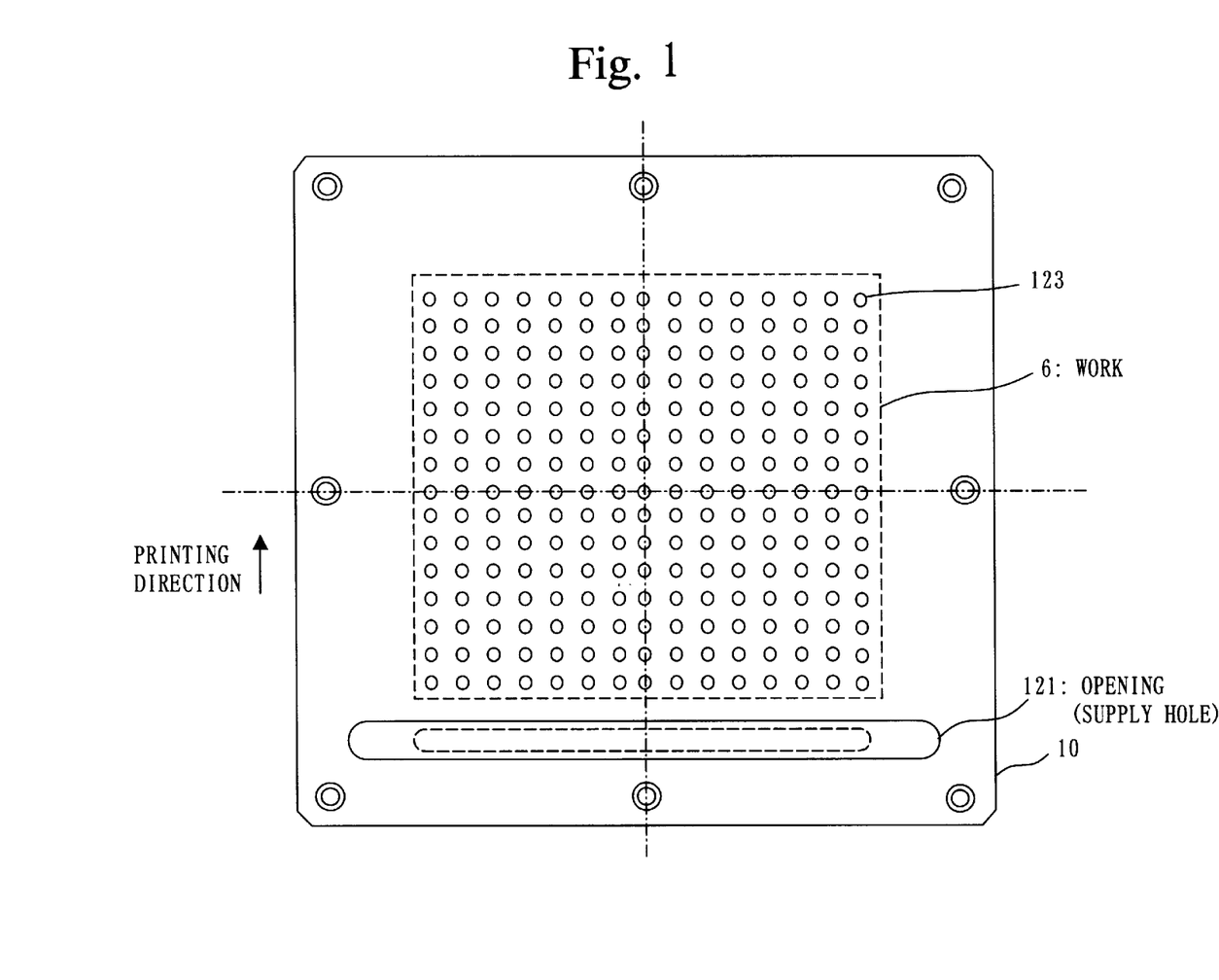
FIG. 1 shows a top view of a table of a screen printer according to the first embodiment of the invention.

FIG. 1 shows a top view of a table of a screen printer according to the first embodiment of the invention.

In FIG. 1, a reference numeral 10 shows a table, 121 shows an opening which is a part of a supply hole, and 123 shows a suction hole. The opening 121 is formed as a long slot which is long in an approximately right angle direction against the printing direction. The suction hole 123 places and fixes a printing material on the table by sucking. The opening 121 is formed at a position so as not to contact with the printing material when the printing material is fixed to the table by sucking with the suction hole 123. The opening 121 is formed so as to be equal to or longer than a length of the user's side in the printing direction out of four sides of the top face of the work 6. Namely, the width of the opening 121 is at least the width of the work which is placed on the table toward the direction of printing. As discussed below, the opening 121 supplies gas to the screen plate 100.

Figure 2:
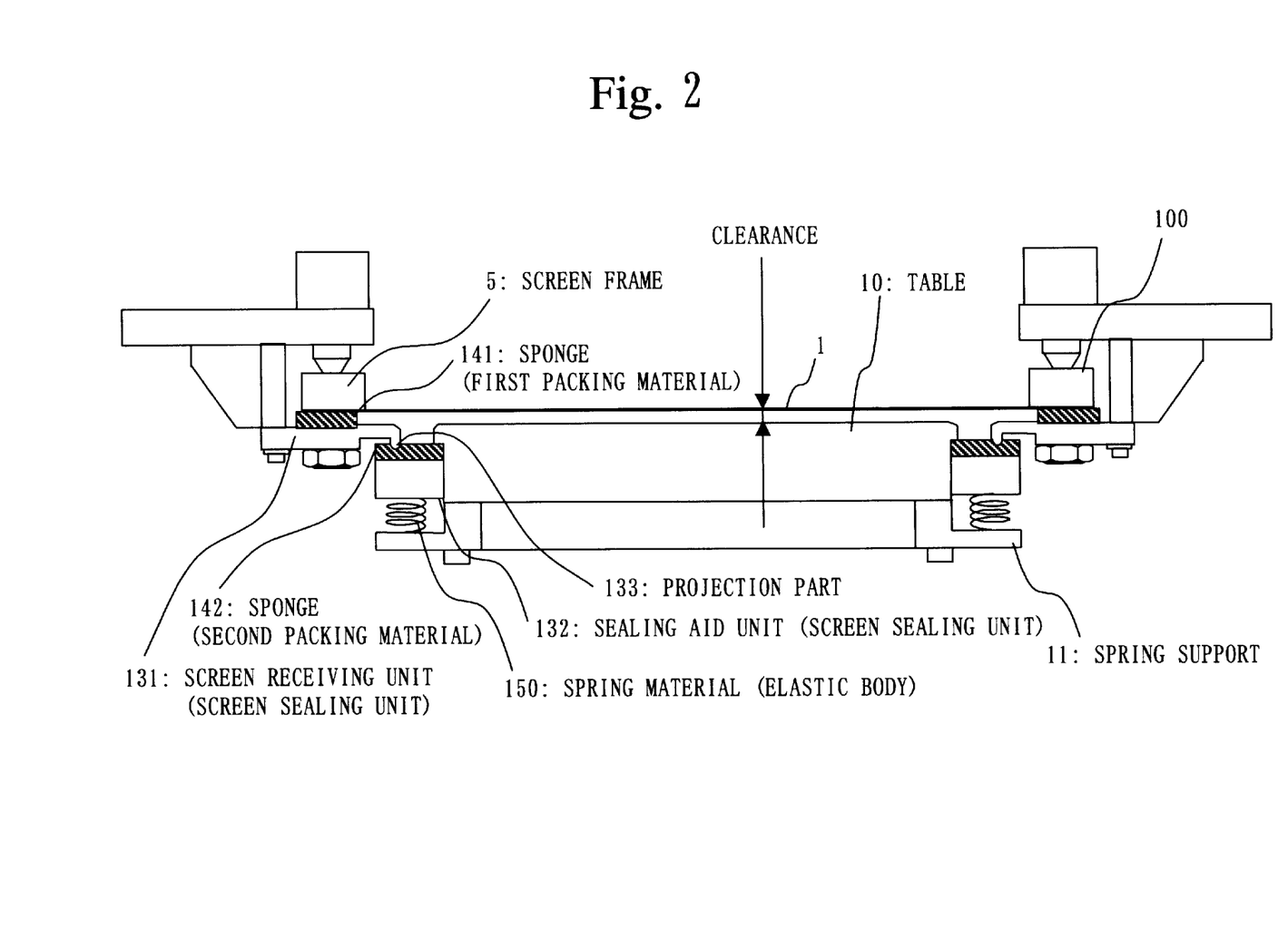
FIG. 2 shows a cross section of the table of the screen printer according to the first embodiment.

FIG. 2 shows a cross section of the table of the screen printer according to the first embodiment of the invention.

In FIG. 2, a reference numeral 1 shows a screen, 5 shows a screen frame, 11 shows a spring support, 100 shows a screen plate, 131 shows a screen receiving unit, 132 shows a sealing aid unit, 133 shows a projection part, 141 shows a sponge which is a part of the first packing material, 142 shows a sponge which is a part of the second packing material, and 150 shows a spring material which is an example of an elastic body. The screen plate 100 has the screen 1 and the screen frame 5. A screen sealing unit has the screen receiving unit 131 and the sealing aid unit 132. The screen receiving unit 131 has the projection part 133. The table 10 is the same as one shown in FIG. 1.

In FIG. 2, the table 10 is placed facing the screen plate 100. The table 10 has an approximate square prismatic shape, and the sealing aid unit 132 is retained by a clearance spring at the side of the table 10. Namely, the sealing aid unit 132 is placed so as to freely slide along the table 10. The sealing aid unit 132 is formed as an approximate square frame matching the shape of the table 10, and the sealing aid unit 132 is retained at the side of the table 10 through plural pieces of the spring material 150 by the spring support 11, of which the bottom face is fixed to the table 10 using plural bolts. The sealing aid unit 132 is pressed and retained by the screen receiving unit 131 through the sponge 142 of which a top face is formed into an approximate square frame matching to the shape of the top face of the sealing aid unit 132. The screen receiving unit 131 is fixed to the printer body. The projection part 133 which is a part of the screen receiving unit 131 is formed as an approximate square frame shape so as not to stick out of the frame of the sealing aid unit 132 to the inside nor the outside. The projection part 133 is formed as a circular shape and projected downward so as to press the sponge 142. To make the projection part 133 projected downward, the pressing area is made smaller than a case where the sponge 142 is pressed by a large plane, and the pressure is increased against a certain pressing power compared with the case where the sponge 142 is pressed by the large plane. The sealing aid unit 132 is inserted between the spring support 11 and the projection part 133 through the sponge 142 and held by them with the repulsion power of the spring material 150, and the sealing aid unit 132 presses the projection part 133. Namely, the sealing aid unit 132 is pressed to the screen receiving unit 131 by the table 10 through the elastic body. On the other hand, the projection part is pressed to the sealing aid unit 132 through the sponge 142. The table 10 can slide upward/downward to adjust its position to the size of the material to be printed. At this time, the spring material 150 should be stretchable so as to cover the sliding amount of the table 10, so that the table 10 presses the projection part 133 even if the table 10 slides.

Accordingly, the space between the projection part 133 and the sealing aid unit 132 is sealed even if the table 10 slides.

The top face of the screen receiving unit 131 is fixed to the screen frame 5 of the screen plate 100 through the sponge 141 so as to press the sponge 141. The sponge 141 is formed as an approximate square frame shape to match the shape of the contacting face of the screen receiving unit 131 and the screen frame 5.

Accordingly, the space between the screen receiving unit 131 and the screen frame 5 is sealed.

Accordingly, the screen sealing unit nearly seals the space between the screen plate 100 and the table 10.

Figure 3:
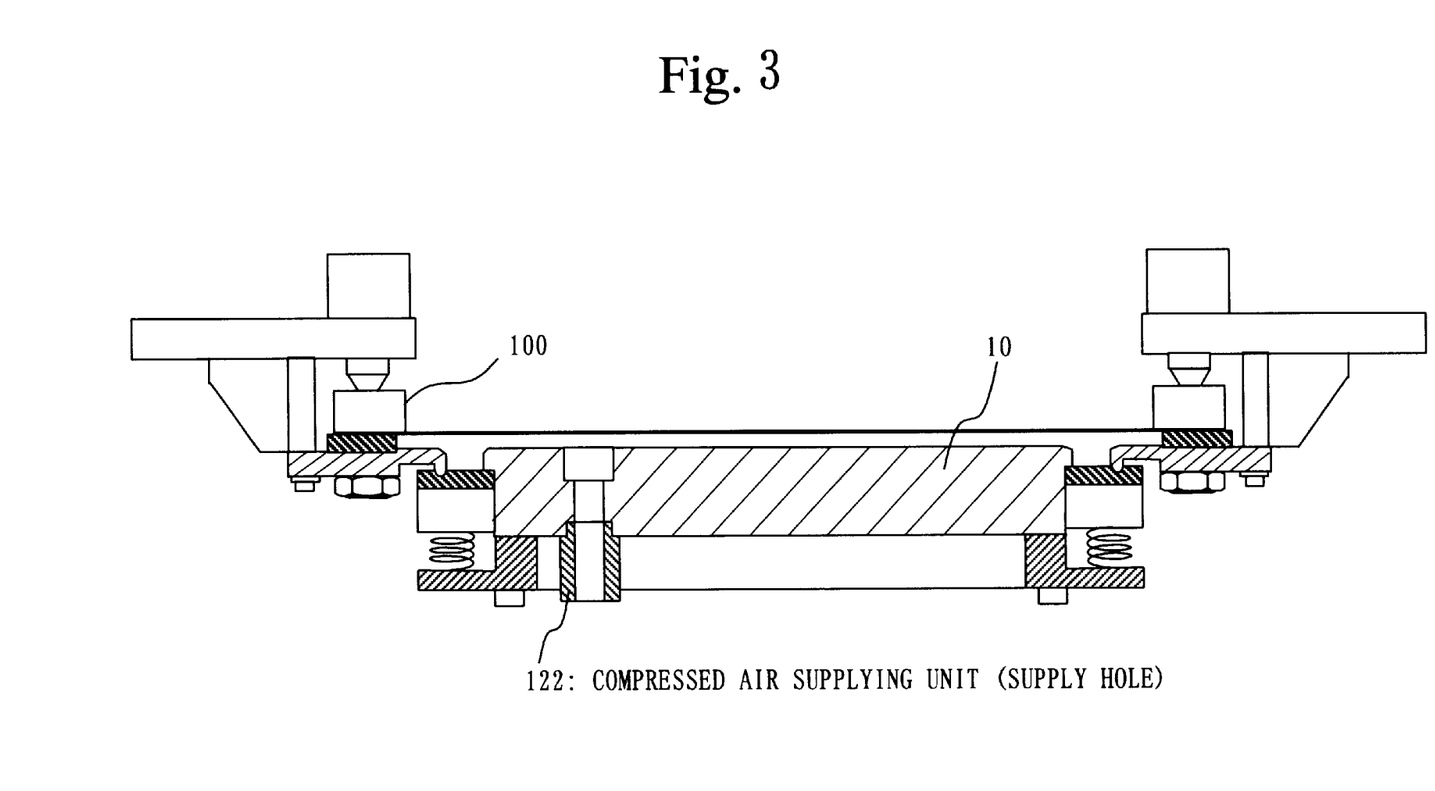
FIG. 3 shows another cross section of the table of the screen printer according to the first embodiment.

FIG. 3 shows a cross section of the table of the screen printer of the first embodiment.

In FIG. 3, a reference numeral 122 shows a compressed air supplying unit which is one example of the supplying hole. FIG. 3 illustrates the compressed air supplying unit 122, which is actually installed in the embodiment of FIG. 2 but not shown in FIG. 2. The table 10 is the same as one in FIGS. 1 and 2. The screen plate 100 is the same as one in FIG. 2. The compressed air supplying unit 122 is provided below the table 10, connected to the opening 121 placed at the upper face of the table 10 shown in FIG. 1, and the compressed air supplying unit 122 supplies gas to the screen plate 100.

Figure 4:
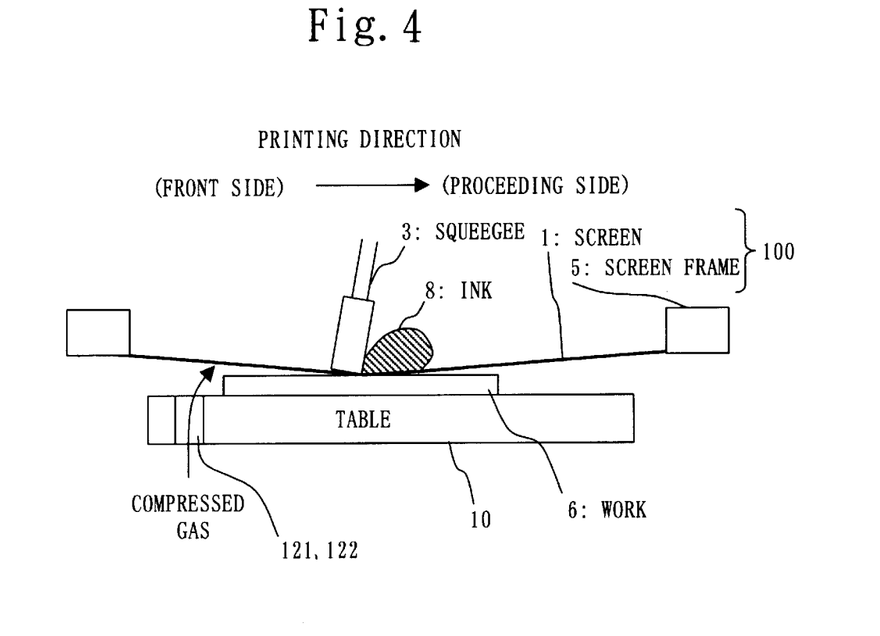
FIG. 4 illustrates printing status of the first embodiment, when a screen sealing unit is omitted.

FIG. 4 shows printing status of the first embodiment, in which the screen sealing unit is omitted.

In FIG. 4, a reference numeral 3 shows a squeegee, 8 shows ink, and 6 shows a work. The opening 121 is the same as one in FIG. 1. The screen 1, the screen frame 5, the screen plate 100 are the same as ones in FIG. 2. The compressed air supplying unit 122 is the same as one in FIG. 3. The table 10 is the same as ones in FIGS. 1, 2, and 3.

In FIG. 4, printing is performed on the work 6 by movement of the squeegee 3 which presses the work 6 and applies the ink 8 to the work 6. Namely, the printing direction of the squeegee 3 is the same as the printing direction discussed in the explanation of FIG. 1.

In FIG. 4, as discussed in the explanation of FIG. 1, the opening 121 is formed at a position where the opening does not contact to the work 6 when the work 6 is fixed to the table by sucking with the suction hole 123. Namely, the opening 121 is formed outside the work 6 placed on the table 10 and at the rear of the squeegee 3 in the printing direction.

The opening 121 applies the gas which is supplied by the compressed air supplying unit 122 to the screen plate 100. When an atmosphere pressure below the screen 1 becomes higher than an atmosphere pressure above the screen 1, namely, the atmosphere pressure below the screen 1 is higher than the atmosphere pressure of the side of the screen 1 opposite to the table which is faced the screen plate 100, it becomes possible to print with easily keeping a clearance between the screen 1 and the work 6 even if the clearance between the screen 1 and the work 6 is small when the printing is performed using the squeegee 3.

Here, it is preferable to use either of air and nitrogen for the gas supplied by the opening 121. Further, it is preferable to use clean air so as to prevent the work 6 from pollution. To prevent the work 6 from pollution, argon, etc. can be used as well as nitrogen which is inert gas.

Figure 5:
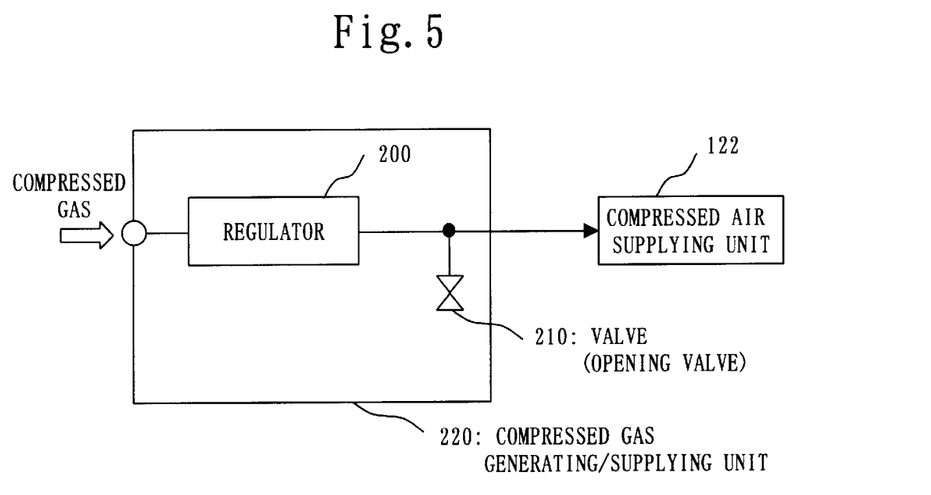
FIG. 5 shows a plumbing diagram of compressed gas.

FIG. 5 shows a plumbing diagram of compressed gas.

In FIG. 5, a reference numeral 200 shows a regulator, 210 shows a valve which is an example of an opening valve, and 220 shows a compressed gas generating/supplying unit. The compressed air supplying unit 122 is the same as ones in FIGS. 3 and 4. The compressed gas generating/supplying unit 220 includes the regulator 200 and the valve 210.

In FIG. 5, the regulator 200 controls the pressure of the supplied gas. After printing, the valve 210 releases the pressure which has been increased by the gas supplied to the nearly sealed space between the screen plate 100 and the table 10.

The compressed gas generating/supplying unit 220 supplies gas, of which the pressure is higher than the pressure of the atmosphere of the side of the screen 1 opposite to the table 10 placed facing the screen plate 100, to the compressed air supplying unit 122.

As described above, according to the first embodiment, the screen printer for performing screen printing using the screen plate includes:

the table 10 placed facing the screen plate 100; and the screen sealing unit which nearly seals the space between the screen plate 100 and the table 10.

In the screen printer of the first embodiment, the screen sealing unit has the first and second packing materials and includes:

the screen receiving unit 131 placed facing the screen plate 100 through the first packing material; and the screen sealing aid unit 132 placed facing the screen receiving unit 131 through the second packing material.

The screen printer of the first embodiment further includes the elastic body, and the sealing aid unit 132 is placed so as to freely slide along the table 10 and is pressed to the screen receiving unit 131 by the table 10 through the elastic body.

According to the first embodiment, the screen receiving unit 131 includes the projection unit 133 which is formed as a circular shape and pressed to the sealing aid unit 132 through the second packing material.

According to the first embodiment, the elastic body is the spring material.

According to the first embodiment, the table 10 includes the supply hole which supplies gas to the screen plate 100.

The screen printer of the first embodiment performs printing on the work 6 using the squeegee 3, and the supply hole is formed outside the work 6 placed on the table 10 and at least one side of fore and rear of the printing direction of the squeegee 3.

In the screen printer of the first embodiment, the supply hole has the opening 121 is formed as a long slot which is long in an approximately right angle direction against the printing direction.

According to the first embodiment, the opening 121 is formed so as to have a width equal to or longer than the width of the work 6 placed on the table 10 in the printing direction of the squeegee 3.

According to the first embodiment, the gas is either of air and nitrogen.

The screen printer of the first embodiment further includes the compressed gas generating/supplying unit, which supplies gas having higher pressure than the atmosphere of the side of the screen 1 opposite to the table 10 placed facing the screen plate 100.

According to the first embodiment, the compressed gas generating/supplying unit includes:

the regulator 200 for controlling the pressure of the gas; and the opening valve which releases the pressure increased by the gas supplied to the space between the screen plate 100 and the table 10.

Embodiment 2.

Figure 6:
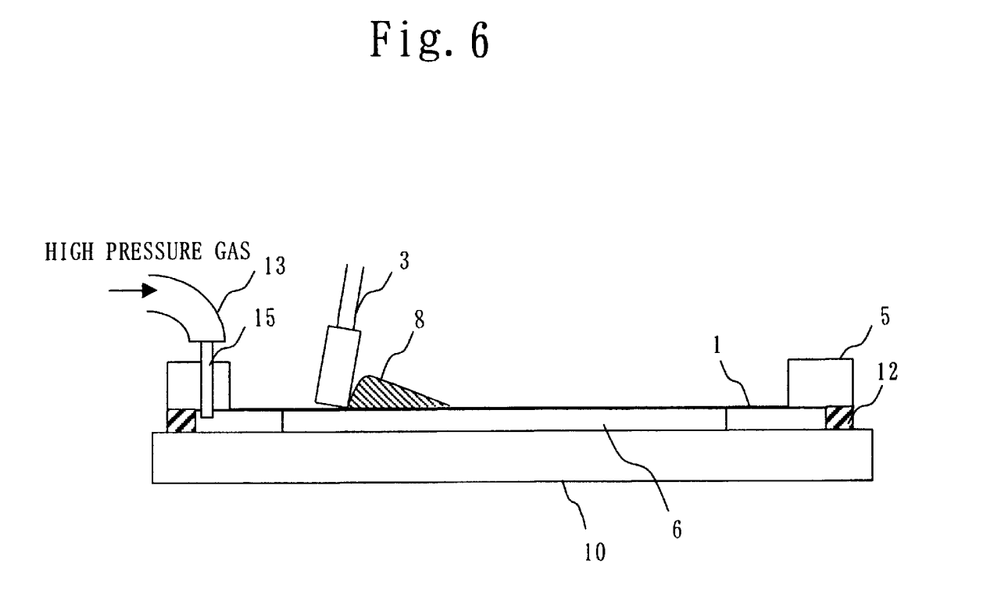
FIG. 6 explains printing in which the pressure of the gas of a part under the screen is made higher than the air pressure.

FIG. 6 explains printing by applying gas having higher pressure than the air pressure to the space below the screen.

In FIG. 6, a reference numeral 1 shows a screen, 3 shows a squeegee, 5 shows a screen frame, 6 shows a work, 10 shows a table, 12 shows a pressure holding frame, 13, and 15 show high pressure gas supplying pipes. According to the printing method shown in FIG. 6, the gas pressure of the space between the screen 1 and the work 6 is increased so as to become higher than the gas pressure of the squeegee 3 side of the screen 1 by introducing the high pressure gas having higher pressure than the air pressure to the space between the screen 1 and the work 6. The pressure holding frame 12 is provided between the screen frame 5 of the screen 1 and the table 10, which seals the space between the screen 1 and the table 10 except the opening. The high pressure gas having higher pressure than the air pressure is introduced through the high pressure gas supplying pipe 15, so that the pressure of the gas in the space between the screen 1 and the work 6 is made higher than the air pressure.

The clearance between the work 6 and the screen 1 is preferably set to equal to or less than 2 mm and equal to or greater than 0.01 mm.

The ink 8 is applied to the screen 1, and printing is performed on the work 6 using the squeegee 3.

During printing, there always exists power to expand toward the side of the screen 1 opposite to the work 6 applied to the screen 1 due to the differential with the air pressure. Accordingly, it becomes possible to perform printing using the squeegee 3 with easily keeping the clearance between the screen 1 and the work 6 even if the clearance between the screen 1 and the work 6 is small.

Embodiment 3.

Figure 7:
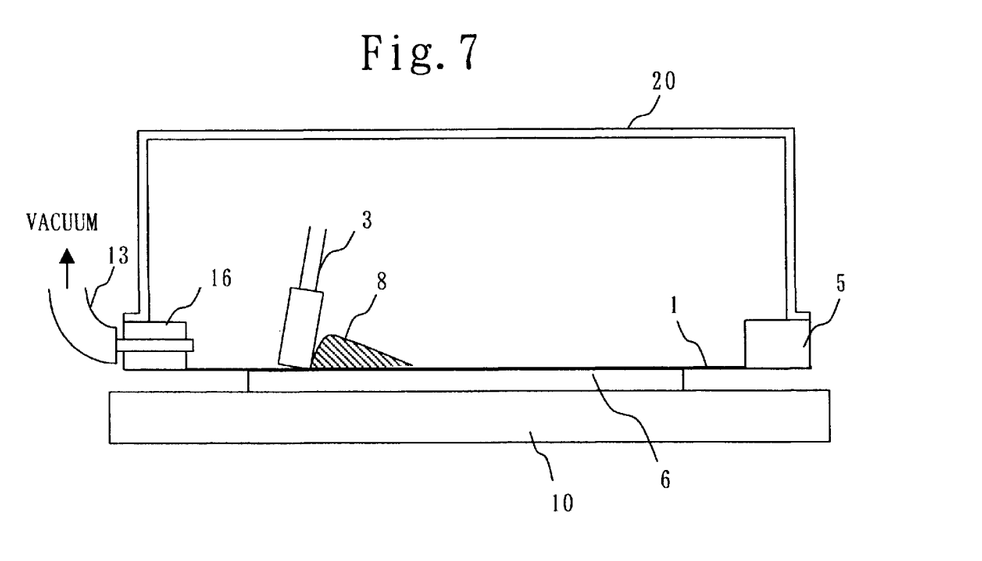
FIG. 7 explains printing in which the pressure of the gas of a part over the screen is made higher than the air pressure.

FIG. 7 explains printing by applying gas having lower pressure than the air pressure to the space over the screen.

In FIG. 7, according to the printing method of the third embodiment, the gas pressure of the space between the screen 1 and the work 6 is increased so as to become higher than the gas pressure of the squeegee 3 side of the screen 1 by reducing the gas pressure of the squeegee 3 side of the screen 1 so as to become lower than the air pressure. A pressure holding case 20 is provided on the screen 1 at the side opposite to the work 6 to hold the gas pressure lower than the air pressure.

The gas existing inside the pressure holding case 20 is set to lower than the air pressure by sucking the gas with a suction pipe 16 using a blower or vacuum pump, and so on.

The clearance between the work 6 and the screen 1 is preferably set to equal to or less than 2 mm and equal to or greater than 0.01 mm.

The ink 8 is applied to the screen 1, and printing is performed on the work 6 using the squeegee 3.

During printing, there always exists power to expand toward the side of the screen 1 opposite to the work 6 applied to the screen 1 due to the differential with the air pressure. Accordingly, it becomes possible to perform printing using the squeegee 3 with easily keeping the clearance between the screen 1 and the work 6 even if the clearance between the screen 1 and the work 6 is small.

Embodiment 4.

Figure 8:
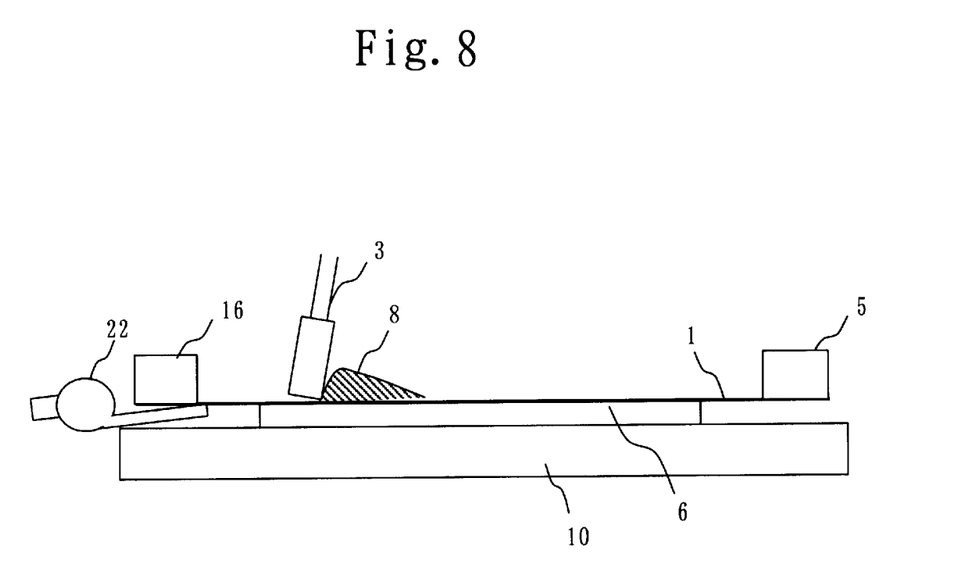
FIG. 8 explains printing in which air is applied to the screen.

FIG. 8 shows a printing method in which the screen 1 and the work 6 is separated by blowing high pressure gas into the space between the screen 1 and the work 6 in the proceeding direction of the squeegee or along the screen 1 in the proceeding direction of the squeegee.

A gas nozzle 22 is provided below the screen 1 so as to blow the high pressure gas into the space between the screen 1 and the work 6 so that the gas flows in the proceeding direction of the squeegee or along the screen 1 in the proceeding direction of the squeegee.

The clearance between the work 6 and the screen 1 is preferably set to equal to or less than 2 mm and equal to or greater than 0.01 mm.

The ink 8 is applied to the screen 1, and printing is performed on the work 6 using the squeegee 3.

During printing, the screen 1 is separated from the work 6 by blowing the gas having higher pressure than the air pressure toward the screen 1. Accordingly, it becomes possible to perform printing using the squeegee 3 with easily keeping the clearance between the screen 1 and the work 6 even if the clearance between the screen 1 and the work 6 is small.

Embodiment 5.

Figure 10:
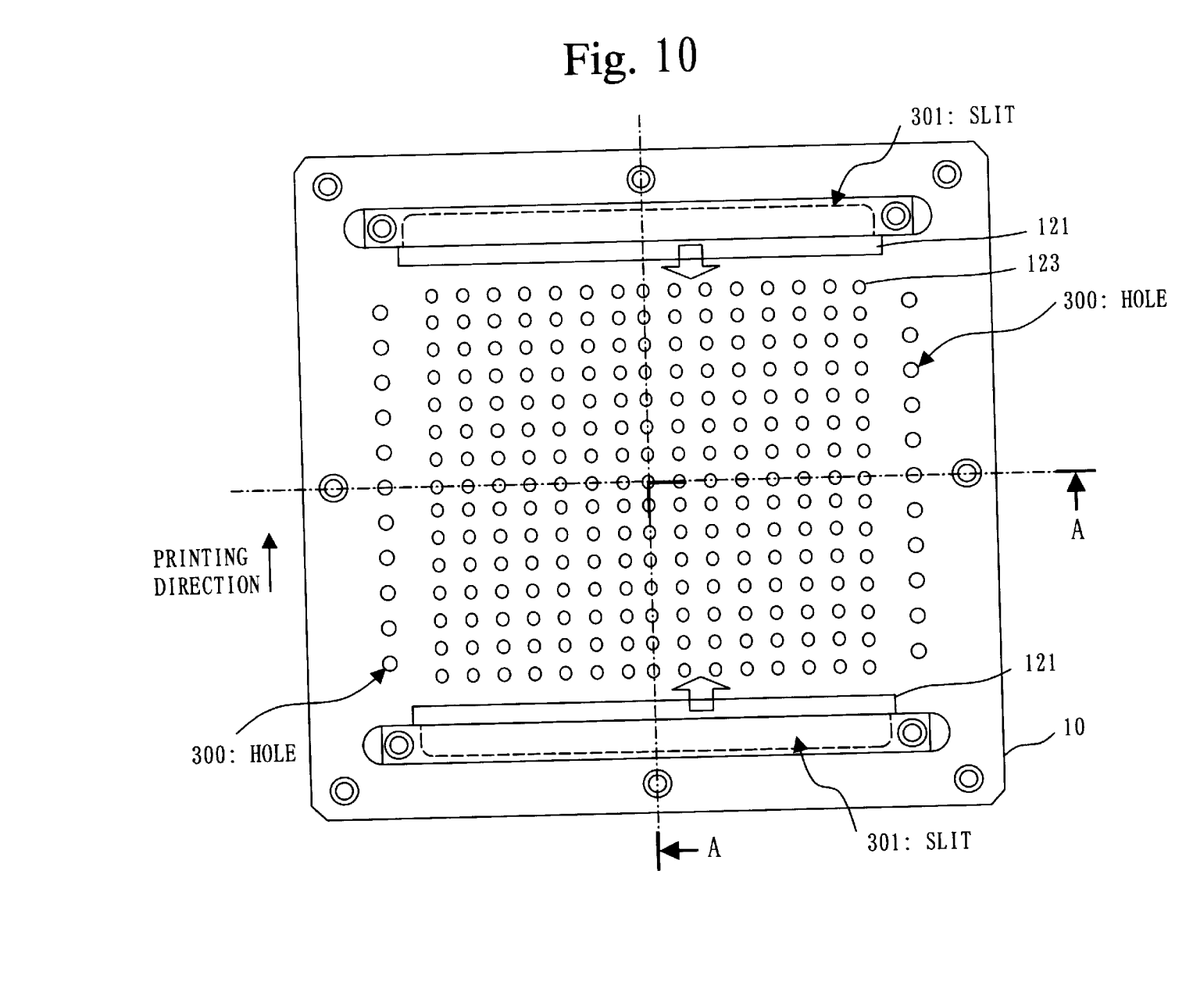
FIG. 10 shows a top view of a table of a screen printer according to the fifth embodiment of the invention.

FIG. 10 shows a top view of the table of the screen printer according to the fifth embodiment.

In FIG. 10, a reference numeral 300 shows a hole (an example of the supply hole), and 301 shows a slit.

Figure 11:
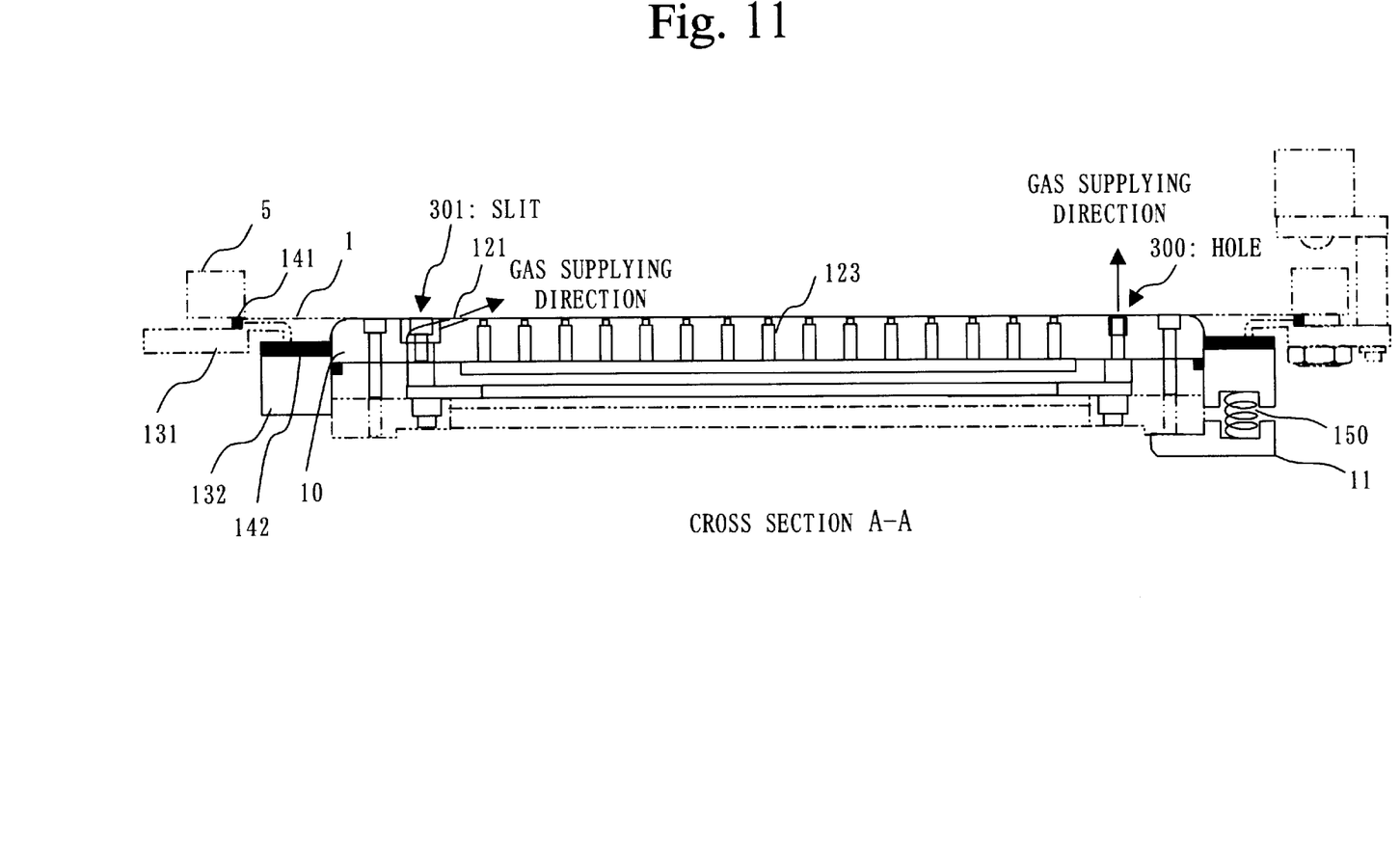
FIG. 11 shows a cross section of FIG. 10 taken along with a line A—A.

FIG. 11 shows a cross section of FIG. 10 taken along the line A—A.

Other configuration elements are the same as ones in the first embodiment.

As shown in FIGS. 10 and 11, the table 10 has, in addition to the opening 121 in FIG. 1, another opening 121 (an example of a supply hole) is provided outside the work 6 which is placed on the table 10, located at the fore of the printing direction of the squeegee 3, and formed as a long slot which is long in an approximately right angle direction against the printing direction of the squeegee 3.

The two openings 121, located at the fore and the rear of the printing direction of the squeegee 3, are formed so as to supply gas against the screen 1 of the screen plate 100 with an angle which is slanted to the work 6. Namely, the openings are formed so as to slantingly blow gas into the space between the screen 1 and table 10. A slit 301 which covers a part of the top face of the opening 121 is provided at the opening 121 so as to control the flow of the gas and to supply the gas to the screen 1 of the screen plate 100 with an angle which is slanted to the work 6.

Further, a hole 300 is provided outside the work 6 placed on the table 10 at both the fore and the rear of printing direction of the squeegee 3 so as to supply the gas toward the screen 1 of the screen plate 100.

Plural holes 300 are provided with a predetermined interval at both sides, however, the holes 300 can be provided at only one side. Further, the hole 300 supplies the gas upward to the screen 1.

Here, the screen printer of the invention has one compressed air supplying unit 122 as shown in FIG. 3, however, plural compressed air supplying units can be provided at plural supplying holes, respectively.

As described above, according to the fifth embodiment, plural supplying units for the gas so as to supply the gas from various directions.

Further, though the opening 121 supplies the gas upward to the screen 1 in the first embodiment, it is better to form the opening 121 so as to slantingly blow the gas into the space between the screen 1 and the table 10.

As described above, according to the fifth embodiment, in the screen printer for printing on the work 6 using the squeegee 3, the supply hole is formed outside the work 6 placed on the table 10 and formed at least at one of the fore and the rear of the printing direction of the squeegee 3.

Further, according to the fifth embodiment, in the screen printer for printing on the work 6 using the squeegee 3, the table 10 has a supply hole which is formed outside the work 6 placed on the table 10 and formed at least at one of the fore and the rear of the printing direction of the squeegee 3 so as to supply the gas toward the screen plate 100 with the angle which is slanted to the work 6.

Further, according to the fifth embodiment, the supply hole is formed outside the work 6 placed on the table 10 and formed at least at one of the fore and the rear of the printing direction of the squeegee 3 so as to supply the gas toward the screen plate 100.

Embodiment 6.

Figure 12:
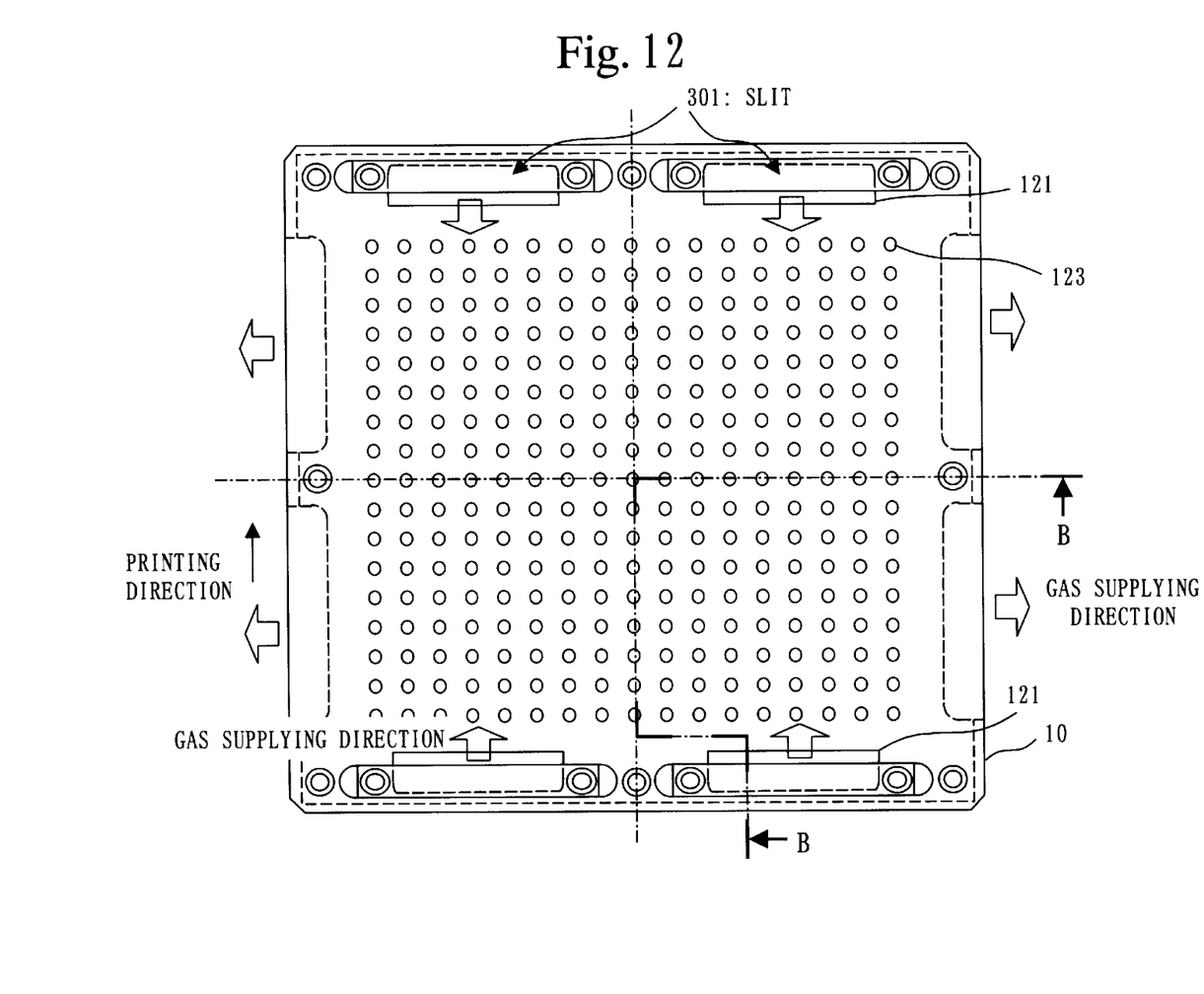
FIG. 12 shows a top view of a table of a screen printer according to the sixth embodiment of the invention.

FIG. 12 shows a top view of a screen printer according to the sixth embodiment.

Figure 13:
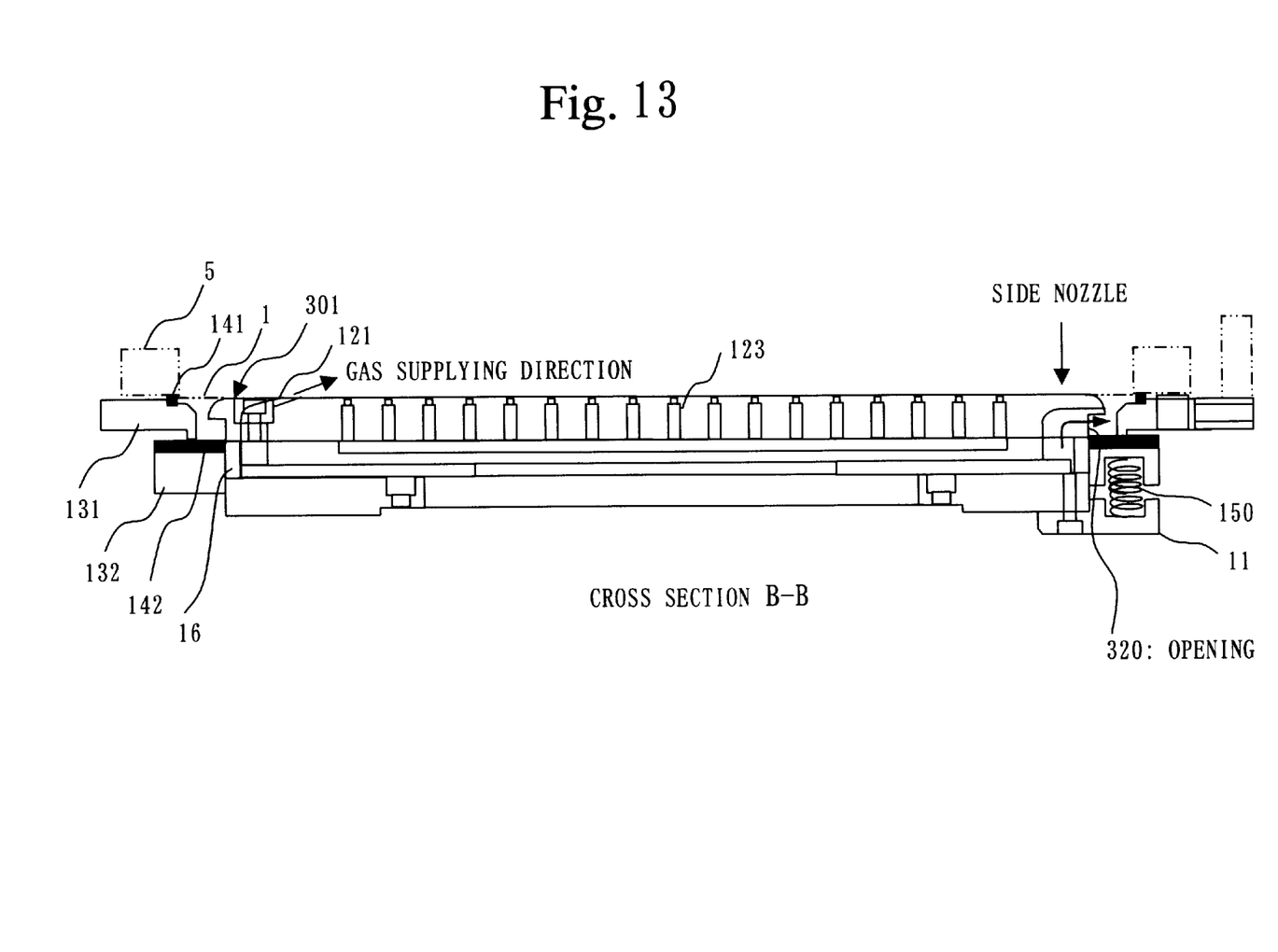
FIG. 13 shows a cross section of FIG. 12 taken along with a line B—B.

FIG. 13 shows a cross section of FIG. 12 taken along the line B—B.

In FIG. 13, a reference numeral 320 shows an opening.

In FIGS. 12 and 13, the openings 121 of the fifth embodiment provided at the fore and the rear are respectively divided into two. The opening 121 is provided between the fixing bolts. Instead of the hole 300 of the fifth embodiment, an opening 320 is provided at the table 10 so as to supply the gas to the space surrounded by the screen plate 100, the table 10, the screen receiving unit 131, and the sponge 142. Namely, the opening 320 blows the gas from the side of the table.

Other elements of the present embodiment are the same as ones in the fifth embodiment.

In this way, it becomes possible to make the printing area large for the predetermined table 10.

Embodiment 7.

Figure 14:
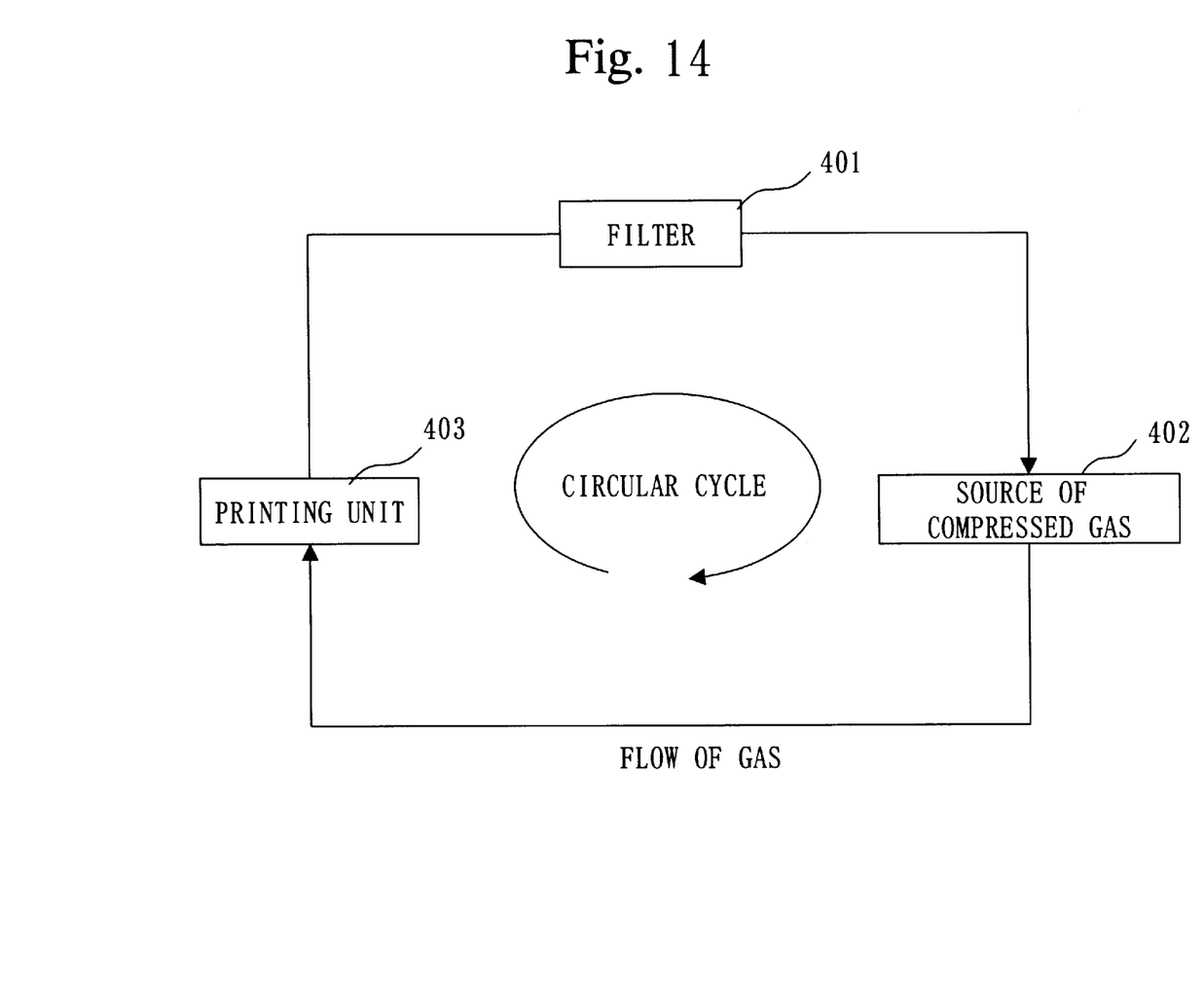
FIG. 14 shows circulation flow diagram of compressed gas.

FIG. 14 shows circulation flow diagram of compressed gas.

In FIG. 14, a reference numeral 401 shows a filter, 402 shows a source of compressed gas (a part of the compressed gas generating unit), and 403 shows a printing unit.

A circular system of the seventh embodiment sends the gas, which is supplied to the almost sealed space among the screen plate 100 and the table 10, to the filter 401, removes foreign objects, that is, filters the gas, sends the gas to the source 402 of compressed gas through the filter 401, increases the pressure of the gas, and supplies the gas to the compressed air supplying unit 122 of the printing unit 403.

In the first embodiment, it is assumed that compressed gas such as dry air or nitrogen is supplied from outside, and the compressed gas which is supplied to the almost sealed space of the device is released to the outside by the valve. The compressed gas is thus assumed to be abandoned.

However, there might be a case in which evaporation amount of volatile solvent, etc. included in the ink 8 might be large by printing with constantly using the air introduced from the outside or fresh nitrogen compared with printing without using the compressed gas.

Accordingly, as shown in FIG. 14, the circular system can be provided to circulate the supplied gas inside the device.

Figure 15:
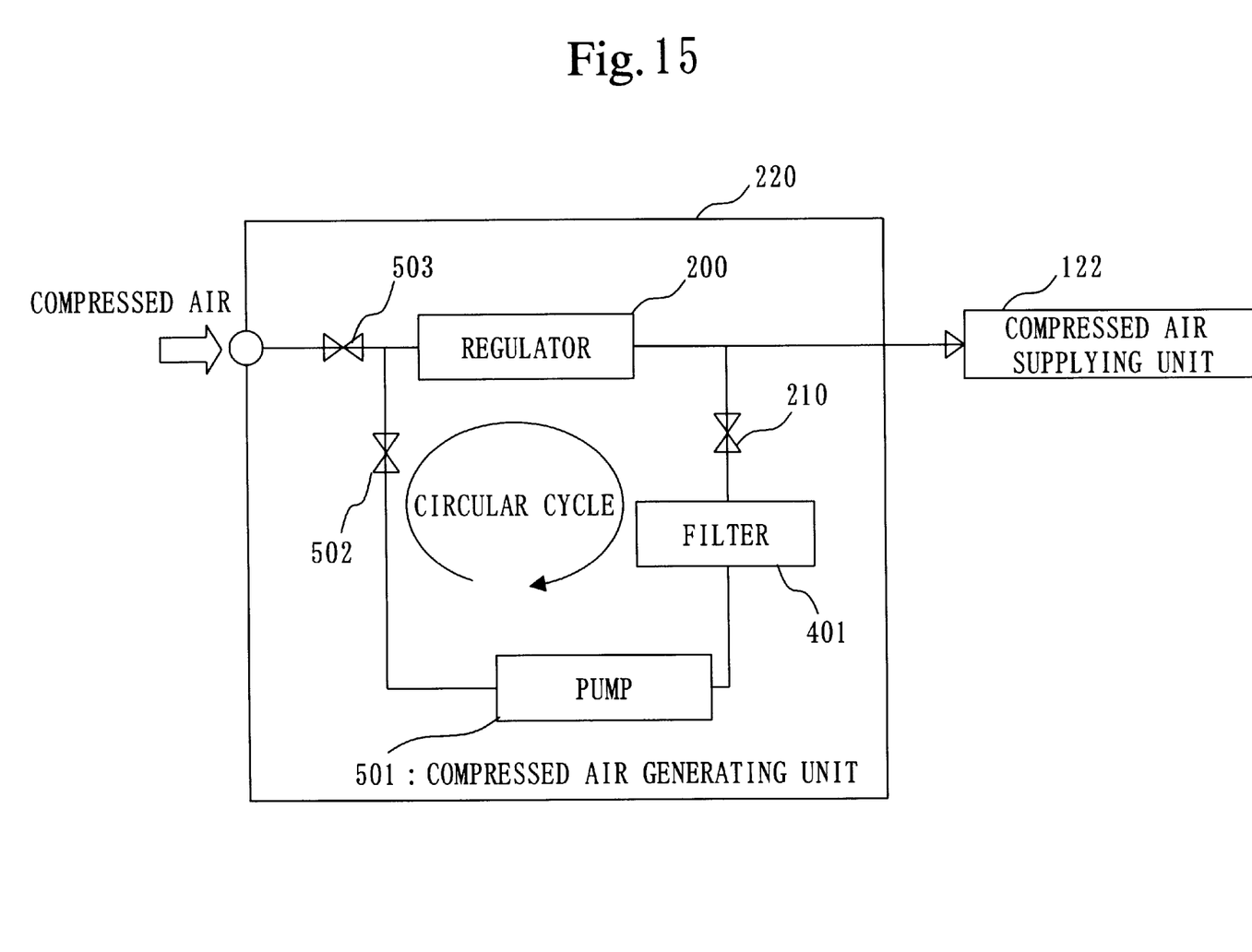
FIG. 15 shows a plumbing diagram of the seventh embodiment.

FIG. 15 shows a plumbing diagram of the seventh embodiment.

In FIG. 15, a reference numeral 501 shows a pump (an example of a compressed gas generating unit), 502 shows a valve, and 503 shows another valve. 401 shows a filter as well as in FIG. 14. Other configuration elements are the same as ones in FIG. 5.

The pump 501 of the seventh embodiment can be replaced with a blower.

At first, the valve 503 is opened, and the valve 502 is closed. The regulator 200 controls the pressure of the gas supplied to the compressed air supplying unit 122. Once the gas is supplied, the valve 503 is closed, and the valve 502 is opened. After printing, the valve 210 releases the pressure increased by the gas supplied into the almost sealed space between the screen plate and the table 10.

After filtered by the filter 401, the released gas is compressed by the pump 501 and returned to the regulator 200 through the valve 502. Thus, the gas which has been used once is circulated and recycled.

In the seventh embodiment, the circulating method is used to restrain the evaporation of the volatile solvent, etc. included in the ink 8, however, it is possible to use gas including the solvent, which is used for the ink 8, in itself.

As discussed above, the screen printer of the seventh embodiment has the compressed gas generating/supplying unit 220, and the compressed gas generating/supplying unit 220 includes:

the filter 401 which filters the gas supplied to the space between the screen plate 100 and the table 10; and the compressed gas generating unit which increases the pressure of the gas filtered by the filter 401 and supplies the gas of which the pressure is increased to the supply hole.

Further, according to the seventh embodiment, the screen printer performs screen printing using the ink including the solvent, and the gas includes the solvent.

Embodiment 8.

Another embodiment will be explained, in which an address electrode is formed by printing on a plasma display backplate of 20 inches using silver paste.

The clearance between the screen 1 and the glass board is set to 0.5 mm, a pressure holding frame is provided between the screen frame and the table which sucks the board, and high pressure air having 0.1 MPa is introduced to a part under the screen frame from a high pressure gas supply pipe.

The size of the screen 1 is set larger than the size of the printing pattern by about 80 mm.

Printing is performed using silver paste, which is a product of Namics Corporation, with a stainless 320 mesh.

Conventionally, the clearance is set to 3–5 mm for printing, however, at this time, there is no problem to print with the clearance of 0.5 mm, keeping the glass board and the screen 1 separated.

As explained above, by making the pressure of the gas between the screen 1 and the work 6 is made higher than the pressure of the gas at the side of printing using the squeegee of the screen 1, a force is operated to the screen mesh to expand toward the side of the screen 1 opposite to the work 6. Accordingly, when printing is performed on the work 6 using the squeegee with the screen 1, by removing the screen 1 from the work 6 using the differential of the pressure of the gas, it becomes possible to perform screen printing with smaller clearance between the screen mesh and the board than the conventional method.

To make the pressure of the gas between the screen 1 and the work 6 higher than the pressure of the gas at the side of printing using the squeegee of the screen 1, the space between the screen 1 and the work 6 is sealed except the opening of the screen 1 and blocked from the outside, and the high pressure gas having higher pressure than the air pressure is introduced into the space between the screen 1 and the work 6. In this way, the pressure of the gas between the screen 1 and the work 6 is made higher than the air pressure. In another way, by sealing the space of the moving section of the squeegee and the side of printing using the squeegee of the screen 1 except the opening to block from the outside, the pressure of the gas at the side of printing using the squeegee of the screen 1 is made smaller than the air pressure using the blower or the vacuum pump, etc.

To remove the screen 1 from the work when the screen printing is performed using the high pressure gas, the high pressure gas having higher pressure than the air pressure is blown to the screen 1 so that the high pressure gas should flow into the clearance between the screen 1 and the work 6 in the proceeding direction of the squeegee or along the screen in the proceeding direction of the squeegee.

It is preferable to set the clearance between the screen 1 and the work 6 to equal to or smaller than 2 mm and equal to or greater than 0.01 mm.

As has been described, in each of the foregoing embodiments, the printing is performed with the small clearance between the screen 1 and the work 6 except a certain part, which is pressed by the squeegee 3, by supplying the gas before the printing, or by making the pressure of the gas between the screen 1 and the work 6 smaller than the pressure of the gas at the side of the screen 1 which contacts the squeegee 3 during a series of operation before printing, on printing, and after printing.

Further, in each of the foregoing embodiments, the gas is supplied from the table 10 or the screen frame 5, however, the application of the embodiments is not limited to this example. It is possible to supply the gas from any element as long as such element supplies the gas into the nearly sealed space between the screen 1 and the work 6. For example, the gas can be supplied from the screen receiving unit 131, the sealing aid unit 132, the sponges 141, or 142.

As discussed above, the screen printer according to each of the foregoing embodiments has a supply hole which supplies the gas into the space nearly sealed by the screen plate 100, the table 10 and the screen sealing unit.

When the screen printing is performed on the work 6 with the screen 1 using the squeegee, by making the pressure of the gas between the screen 1 and the work 6 higher than the pressure of the gas at the side of printing using the squeegee of the screen 1, the screen can be removed from the work 6 using the differential of the pressure of the gas. Accordingly, it becomes possible to perform the screen printing with smaller clearance between the screen mesh and the board than the conventional method, which lengthens the life of the screen and improves the printing accuracy.

Having thus described several particular embodiments of the present invention, various alterations, modifications, and improvements will readily occur to those skilled in the art. Such alterations, modifications, and improvements are intended to be part of this disclosure, and are intended to be within the spirit and scope of the present invention. Accordingly, the foregoing description is by way of example only, and is not intended to be limiting. The present invention is limited only as defined in the following claims and the equivalents thereto.

What is claimed:

1. A screen printer for performing screen printing using a screen plate comprises:

a table placed facing the screen plate;

a screen sealing unit for nearly sealing a space between the screen plate and the table, and wherein the screen sealing unit includes a screen receiving unit placed facing the screen plate, a sealing aid unit placed adjacent the table; and an elastic body, wherein the sealing aid unit is placed slidable along the table and is pressed to the screen receiving unit by the table through the elastic body.

2. The screen printer of claim 1, wherein the screen sealing unit further comprises a packing material, and wherein the screen receiving unit has a projection part circularly formed, and the projection part is pressed to the sealing aid unit through the packing material.

3. A screen printer for performing screen printing using a screen plate and a squeegee, comprising:

a table placed facing the screen plate and having an opening, wherein the screen printer performs screen printing on a work placed on the table using the screen plate and the squeegee, and supplies gas having a higher pressure than a pressure of atmosphere at a side of the screen plate opposite to the table, and wherein the opening supplies gas to the screen plate, and is formed outside the work placed on the table and at least at one of fore and rear in a printing direction of the squeegee as a long slot which is long in an approximately right angle direction against the printing direction of the squeegee.

4. The screen printer of claim 3 further comprising:

a regulator for controlling a pressure of the gas; and an opening valve for releasing a pressure which is increased by the gas supplied into a space between the screen plate and the table.

5. The screen printer of claim 4, further comprising:

a filter for filtering the gas supplied to the space which is nearly sealed between the screen plate and the table; and a compressed gas generating unit for increasing a pressure of the gas filtered and supplying the gas of which the pressure is increased to the opening.

6. The screen printer of claim 3, wherein the screen printer performs screen printing using ink including solvent, and wherein the gas includes the solvent.

7. A screen printer for performing screen Printing using a screen plate comprising:

a table placed facing the screen plate;

a screen sealing unit for nearly sealing a space between the screen plate and the table, and wherein the screen sealing unit includes a screen receiving unit placed facing the screen plate, a sealing aid unit placed adjacent the table; and wherein the screen printer performs screen printing on a work using a squeegee, and wherein the table includes a supply hole which is formed at least at one of fore and rear of the table in a printing direction of the squeegee and supplies gas toward the screen plate with an angle slanted to the work.

8. The screen printer of claim 7, further including a supply hole formed at least at one of sides of the table in a printing direction of the squeegee and supplies gas to the screen plate.

9. A screen printer for performing screen printing using a screen plate comprising:

a table placed facing the screen plate;

a screen sealing unit for nearly sealing a space between the screen plate and the table, and a supply hole provided in said table for supplying gas into the space which is nearly sealed by the screen plate, the table, and the screen sealing unit;

wherein the screen sealing unit includes a screen receiving unit placed facing the screen plate, and a sealing aid unit placed adjacent the table.

* * * * *

UNITED STATES PATENT AND TRADEMARK OFFICE
CERTIFICATE OF CORRECTION

PATENT NO. : 6,776,089 B2
DATED : August 17, 2004
INVENTOR(S) : Shinji Kanda It is certified that error appears in the above-identified patent and that said Letters Patent is hereby corrected as shown below:

<u>Title page,</u>
Item [73], Assignee, please change "Canon Kabushiki Kaisha, Tokyo (JP)" to --
MICRO-TEC COMPANY, LTD., Chiba (JP) and SHINJI KANDA, Aichi, (JP) --.

Signed and Sealed this

Twenty-second Day of March, 2005

JON W. DUDAS
*Director of the United States Patent and Trademark Office*